United States Patent
Shahriari et al.

(10) Patent No.: US 6,765,399 B2
(45) Date of Patent: Jul. 20, 2004

(54) TEST SOCKET AND SYSTEM

(75) Inventors: Nader Shahriari, Chandler, AZ (US); Clayton W. Carpenter, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/328,344

(22) Filed: Dec. 23, 2002

(65) Prior Publication Data

US 2003/0090283 A1 May 15, 2003

Related U.S. Application Data

(63) Continuation of application No. 09/746,340, filed on Dec. 22, 2000, now Pat. No. 6,535,006.

(51) Int. Cl.[7] .............................................. G01R 31/02
(52) U.S. Cl. ...................................................... 324/755
(58) Field of Search ................................ 324/755, 754, 324/158.1, 765, 758, 761, 72.5; 439/359, 364, 362; 174/206, 210

(56) References Cited

U.S. PATENT DOCUMENTS

| | | | |
|---|---|---|---|
| 3,880,493 A | * 4/1975 | Lockhart, Jr | 439/147 |
| 5,249,972 A | 10/1993 | Walker | 439/72 |
| 5,387,861 A | 2/1995 | Neiderhofer | 324/158.1 |
| 5,602,490 A | 2/1997 | Blumenau | 324/754 |
| 5,869,961 A | 2/1999 | Spinner | 324/158.1 |
| 5,923,176 A | 7/1999 | Porter et al. | 324/754 |
| 5,967,848 A | 10/1999 | Johnson et al. | 439/620 |
| 6,002,178 A | 12/1999 | Lin | 257/778 |
| 6,049,217 A | 4/2000 | Viswanath et al. | 324/760 |
| 6,064,217 A | 5/2000 | Smith | 324/760 |
| 6,064,218 A | 5/2000 | Godfrey et al. | 324/762 |
| 6,072,322 A | 6/2000 | Viswanath et al. | 324/754 |
| 6,079,999 A | 6/2000 | Terry et al. | 439/326 |
| 6,175,241 B1 | 1/2001 | Hembree et al. | 324/755 |
| 6,422,901 B1 | * 7/2002 | Belopolsky | 439/620 |
| 6,535,006 B2 | * 3/2003 | Shahriari et al. | 324/755 |

* cited by examiner

Primary Examiner—Evan Pert
Assistant Examiner—Jimmy Nguyen
(74) Attorney, Agent, or Firm—Schwegman, Lundberg, Woessner & Kluth, P.A.

(57) ABSTRACT

A test socket and system for testing packaged electronic circuits. The test system includes a control unit coupled by a communication channel to a socket which provides a location for mounting and testing a packaged electronic circuit. The socket includes one or more designated pairs of electrical connectors that provide power to the packaged electronic circuit. Each of the one or more designated pairs of electrical connectors includes a first electrical connector and a second electrical connector. In one embodiment, the first electrical connector and the second electrical connector in one or more pairs of designated connectors are connected together by a capacitor. In another embodiment, one or more capacitors that connect together the first electrical connector and the second electrical connector in one or more designated pairs of electrical connectors are packaged and embedded in the body of the socket.

14 Claims, 3 Drawing Sheets

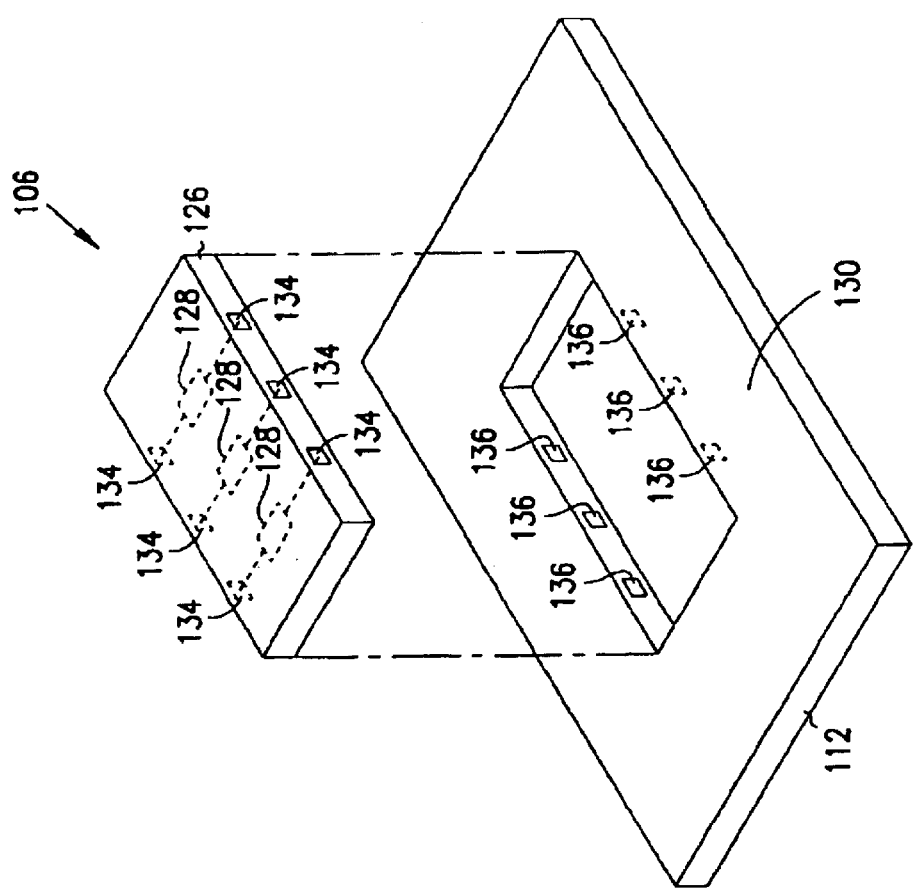

TEST SOCKET AND SYSTEM

RELATED APPLICATION

This application is a continuation under 37 C.F.R. 1.53(b) of U.S. patent application Ser. No. 09/746,340 filed Dec. 22, 2000 now U.S. Pat. No. 6,535,006, which application is incorporated herein by reference.

FIELD

The present invention relates to circuit testers for electronic circuits, and more particularly, to a test socket for use in an electronic circuit tester.

BACKGROUND

A test socket provides a platform for mounting a packaged electronic circuit, such as an integrated circuit, in a test system. Packaged electronic circuits include packaged single-die electronic circuits and packaged multi-die electronic circuits. A package protects an electronic circuit from the environment and provides a set of pins for coupling the electronic circuit to a socket, such as a test socket.

In a test system, a test socket is typically mounted on a test substrate coupled to a control unit. The test substrate usually includes electronic interconnects, such as thin, narrow, conductive strips, for coupling electronic signals between the test socket and the control unit. The control unit includes a processor that communicates with a device under test (a packaged electronic circuit mounted on the test socket) by transmitting electronic signals to the packaged electronic circuit and receiving electronic signals from the packaged electronic circuit.

A test socket includes electrical connectors that have electrical characteristics, such as resistance, inductance, and capacitance. Preferably, the electrical characteristics of the electrical connectors included in a test socket are identical to the electrical characteristics of the electrical connectors included in a production socket. A production socket is a socket for mounting a packaged electronic circuit in the packaged electronic circuit's intended operating environment. Unfortunately, the electrical characteristics of test socket electrical connectors are not always identical to the electrical characteristics of production socket electrical connectors. One reason for the differences is that test socket electrical connectors are designed to continue to operate after thousands of insertions while a production socket electrical connector is not typically designed to function for more than about one-hundred or fewer insertions. A test socket electrical connector designed for thousands of insertions usually has mechanical characteristics that differ from the mechanical characteristics of a production socket electrical connector designed for one-hundred insertions. These differences in mechanical characteristics lead to differences in electrical characteristics.

Testing a simple, low frequency electronic circuit on a tester having a test socket with electrical characteristics that differ from the electrical characteristics of the packaged circuit's production socket does not usually cause false failures. A false failure is a failure which occurs during the test of an electronic circuit in a test environment, but which does not occur when the packaged electronic circuit is operating in the packaged electronic circuit's intended operating environment.

However, testing a complex, high frequency electronic circuit on a tester having a test socket with electrical characteristics that differ from the electrical characteristics of the packaged circuit's production socket can cause false failures. At high frequencies, different electrical characteristics in the electrical connectors can lead to significant differences between the amount of noise on the electrical connectors that couple power to the packaged electronic circuit being tested and the amount of noise on the electrical connectors that couple power to the packaged electronic circuit operating in its normal operating environment. These differences in noise can result in false failures in testing of the packaged electronic circuit.

For these an other reasons there is a need for the present invention.

BRIEF DESCRIPTION OF THE DRAWINGS

FIG. 1C is an exploded view of one embodiment of the test socket shown in FIG. 1B including a capacitor package and an embedded capacitor according to the teachings of the present invention.

DESCRIPTION

Figure 1A:
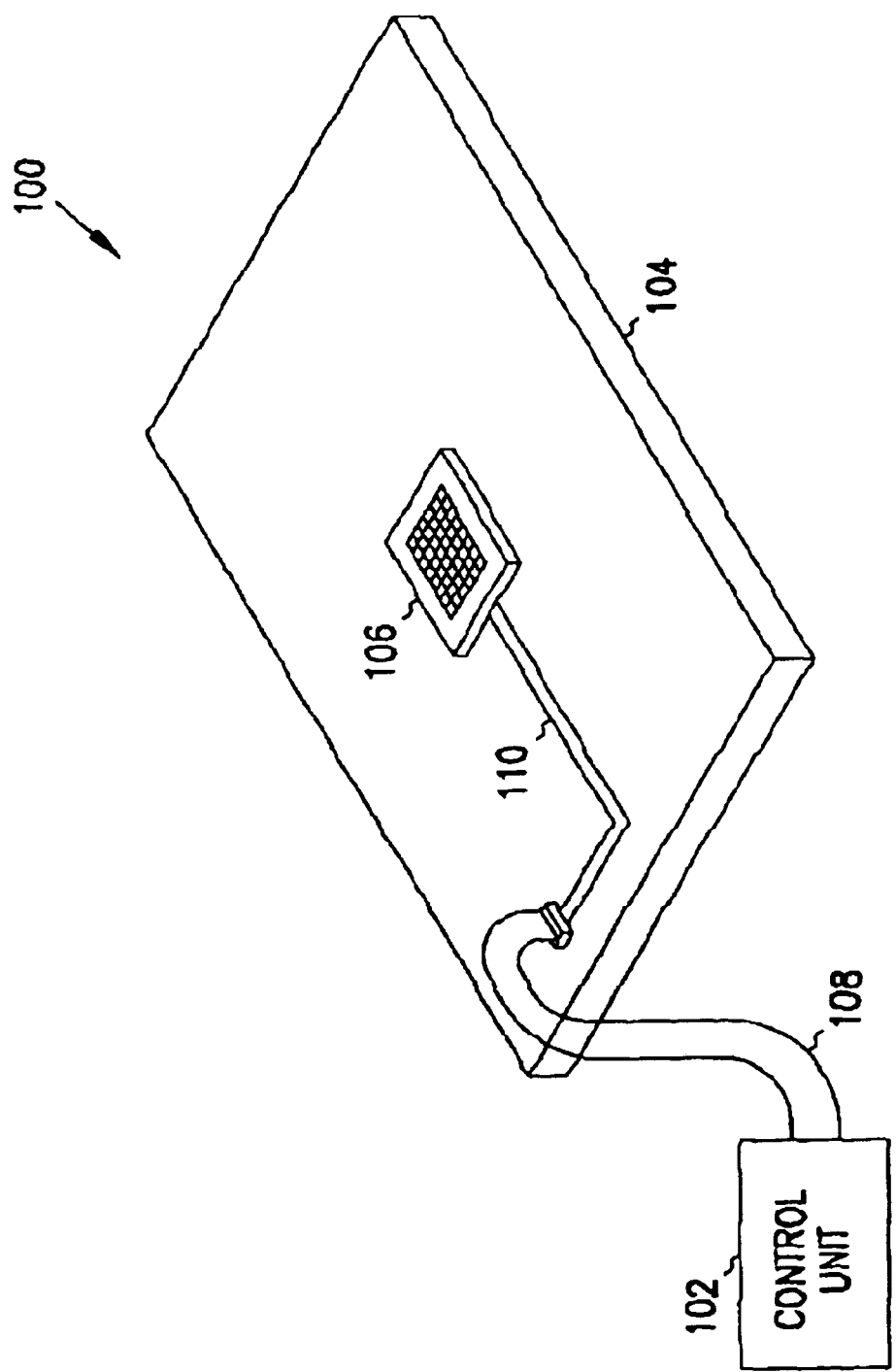
FIG. 1A is an illustration of one embodiment of an electronic circuit tester according to the teachings of the present invention.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A is an illustration of one embodiment of an integrated circuit tester 100 according to the teachings of the present invention. Integrated circuit tester 100 includes a control unit 102, a substrate 104, and a test socket 106. The control unit 102 is electrically coupled to the substrate 104 by a communication channel 108 and is capable of sending signals to the substrate 104 and receiving signals from the substrate 104. The substrate 104 provides a platform for mounting the test socket 106 and coupling signals between the control unit 102 and the test socket 106. In operation, a packaged electronic circuit (not shown) is mounted in the test socket 106 for testing.

The control unit 102 is preferably a computing system which includes a processor, such as a microprocessor, and storage devices, such as semiconductor storage devices and magnetic storage devices.

The communication channel 108 couples signals between the control unit 102 and the substrate 104. The communication channel 108 is not limited to a particular type of communication channel. Exemplary communication channels suitable for use in connection with the present invention include electrical cable channels, fiber optic channels, radio frequency channels, and optical channels, such as infrared terrestrial channels. Those skilled in the art appreciate that a packaged electronic circuit (not shown) can be mounted on the test socket 106 of the electronic circuit tester 100 and that the control unit 102 can be programmed to test the packaged electronic circuit by sending input test signals to the packaged electronic circuit, receiving output test signals from the packaged electronic circuit, and comparing the output test signals to a set of expected signals.

The substrate 104 is preferably fabricated from a non-conductive material, such as an epoxide or a ceramic, and includes a communication channel 110 for coupling signals between the test socket 106 and the channel 108. The communication channel 110 is not limited to a particular type of communication channel. Transmission lines, such as microstrip or stripline transmission lines, optical transmission lines, such as fiber optic cables, and terrestrial electromagnetic communication channels are all suitable for use in connection with the present invention. Those skilled in the art will appreciate that the communication channel 108 and the communication channel 110 can be combined into a single communication channel for use in connection with the present invention.

Figure 1B:
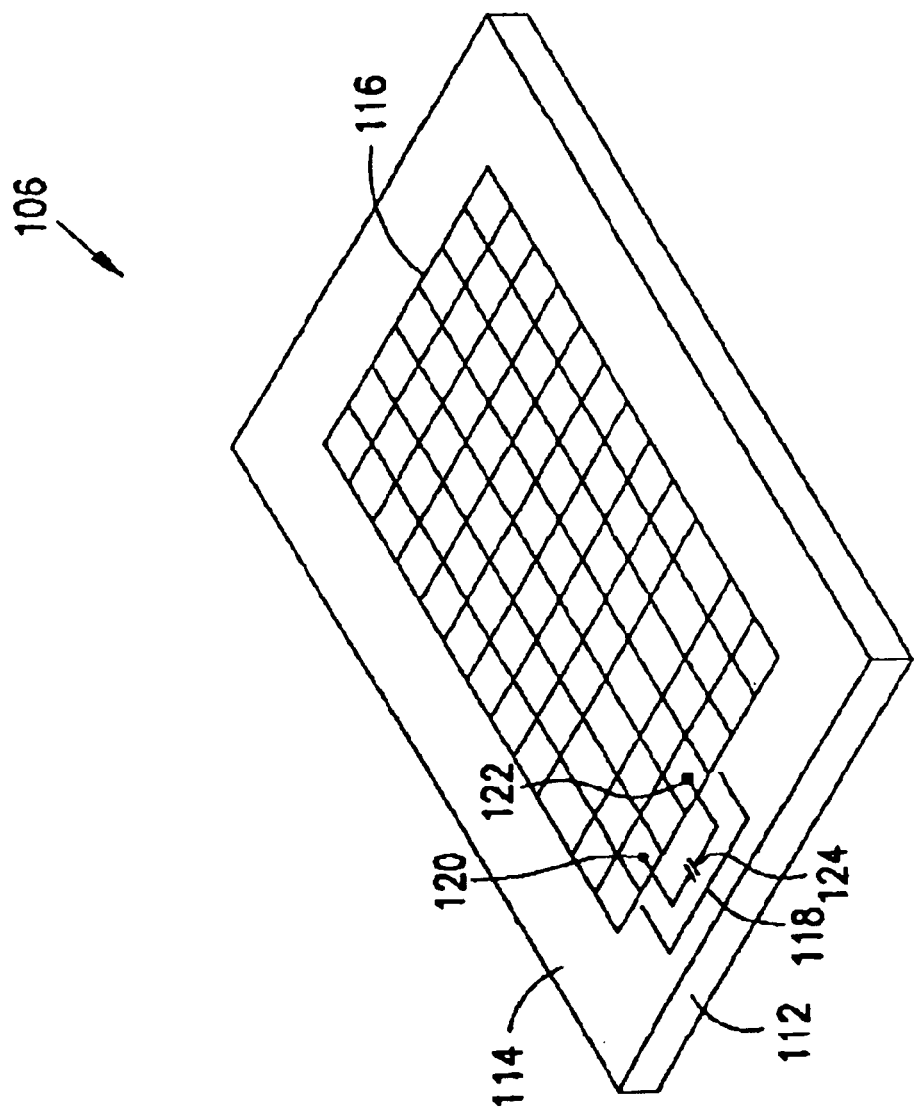
FIG. 1B is a magnified perspective view of one embodiment of a test socket according to the teachings of the present invention.

FIG. 1B is a magnified perspective view of one embodiment of the test socket 106 according to the teachings of the present invention. The test socket 106 includes a body 112 having a surface 114, electrical connectors 116 disposed on the surface 114, a designated pair of electrical connectors 118, including a first electrical connector 120 and a second electrical connector 122, and a capacitor 124 connecting the first electrical connector 120 to the second electrical connector 122.

The body 112 is preferably fabricated from a non-conductive material, such as a ceramic, an epoxide, or a plastic. The body 112 includes cavities for embedding the electrical connectors 116. Exemplary methods of manufacture suitable for use in the fabrication of the body 112 include molding, machining, and casting, however the methods of manufacture are not limited to these methods. Those skilled in the art will appreciate that other methods, such as laminating, or combinations of methods, such as laminating and machining, may also be employed in the fabrication of the body 112.

The electrical connectors 116 are disposed on the surface 114 of the body 112, but the electrical connectors 116 are not limited to a particular arrangement on the surface 114. The electrical connectors 116 are preferably arranged such that the electrical connectors or pins of a packaged electronic circuit (not shown) can mate with the electrical connectors 116. Thus, any arrangement of electrical connectors 116 used in the manufacture of a packaged electronic circuit is contemplated by the present invention as an arrangement for the electrical connectors 116. In one embodiment of the present invention, the electrical connectors 116 are arranged in rows and columns, as shown in FIG. 1B.

The electrical connectors 116 are not limited to a particular number of connectors. Typically, the number of electrical connectors included in the test socket 106 is selected to be equal to the number of electrical connectors or pins in the packaged electronic circuit intended for mounting and testing in the test socket 106. In one embodiment, one-hundred or more electrical connectors 116 are included in the test socket 106. In another embodiment, one-thousand or more electrical connectors 116 are included in the test socket 106. In still another embodiment, two-thousand or more electrical connectors 116 are included in the test socket 106. And in yet another embodiment, five-thousand or more electrical connectors 116 are include in the test socket 106.

The electrical connectors 116 are not limited to a particular type of connector. Any connector suitable for use in a test socket is suitable for use in connection with the present invention. Typically, the electrical connectors 116 are selected to meet particular electrical and mechanical requirements. Electrical requirements include specifications relating to inductance, capacitance, and resistance. Preferably, the electrical connectors 116 have electrical characteristics that are substantially identical to the electrical characteristics of the electrical connectors included in the production socket intended for use in connection with the packaged electronic circuit being tested. Mechanical requirements include insertion force and mean number of insertions to failure. Preferably, the insertion force is less than one ounce and the mean number of insertions to failure is in the hundreds of thousands. In one embodiment, the electrical connectors 116 are spring load electrical connectors, such as pogo pin electrical connectors, which are known in the art. In one embodiment, each of the electrical connectors 116 is a pogo pin electrical connector having a contact area of about 0.025 square inches, a travel distance of about 0.0125 inches, a spring constant of about 5 ounces per inch, and an initial preload force of about 0.25 ounces.

The designated pair of electrical connectors 118 is typically one or more pairs of connectors that provide power to the packaged electronic circuit 106. In complex packaged electronic circuits, such as microprocessors, hundreds of designated pairs of electrical connectors 118 can be used to supply power to the circuits.

The capacitor 124 is connected between the first electrical connector 120 and the second electrical connector 122, which typically provide power to the packaged electronic circuit mounted in the test socket 106. One method of connecting the capacitor 124 between the first electrical connector 120 and the second electrical connector 122 includes attaching leads to the first electrical connector 120 and the second electrical connector 122, embedding the leads in the body 112, and attaching the plates or leads of the capacitor 124 to the embedded leads. Exemplary methods of attaching the leads to the first electrical connector 120, the second electrical connector 122, and the plates of the capacitor 124 include soldering and brazing. Preferably, the capacitor lead lengths are short. If the capacitor lead lengths are not short, then parasitic capacitances from the leads are included in the finite element analysis used to determine the electrical characteristics of the first electrical connector 120 and the second electrical connector 122.

The capacitance value of the capacitor 124 is selected to modify or lower the inductance in the first electrical connector 120 and the second electrical connector 122. The capacitor 124 modifies or lowers the inductance in the first electrical connector 120 and the second electrical connector 122 by providing a conductive path between the first electrical connector 120 and the second electrical connector 122 at selected frequencies. To select a capacitance value for the capacitor 124, the electrical characteristics of a production socket and the test socket 106 are determined. A production socket is a socket used for mounting an electronic circuit under test in the electronic circuit's intended operating environment. Electrical characteristics of the production socket can be determined by direct measurement or by finite element analysis. The value of the capacitor 124 is selected to produce an inductance in the first electrical connector 120 and the second electrical connector 122 that is substantially identical to the inductance of the corresponding electrical connectors in the production socket. The capacitor 124 is not limited to a particular type of capacitor. In one embodiment, the capacitor 124 is a high frequency capacitor. In an another embodiment, the capacitor 124 is a ceramic high frequency capacitor.

The test socket 106 is not limited to use in connection with one capacitor 124. Typically, one or more of the designated pairs of electrical connectors 118, which provide power to the packaged electronic circuit being tested, include a capacitor connecting the first electrical connector 120 to the second connector 122 in the designated pair of electrical connectors.

FIG. 1C is an exploded view of the back side of one embodiment of the test socket 106 including a capacitor package 126 and embedded capacitors 128 according to the teachings of the present invention. The back side of the test socket 106 is the side of the test socket 106 (shown in FIG. 1B) located opposite from the surface 114 on which the electrical connectors 106 are disposed. The body 112 includes a cavity 130 capable of receiving the capacitor package 126. The capacitor package 126 includes a plurality of connectors 134 for coupling the capacitors 128 to the electrical connectors 116 (shown in FIG. 1B). The capacitors 128 are coupled to the electronic connectors 116 through the plurality of connectors 136 which are formed on the sides of the cavity 130 and coupled to the electronic connectors 116. Preferably, the capacitors in the capacitor package 126 are arranged such that any orientation of the capacitor package 126 in the cavity 130 results in the capacitors 128 being correctly coupled to the plurality of connectors 136.

In one embodiment, the capacitor package 126 is permanently embedded in the test socket 106. The capacitor package 126 is permanently embedded when the capacitor package 126 is only removable from the test socket 106 using tools. However, the capacitor package 126 is not limited to a package that is permanently embedded in the test socket 106. In another embodiment, the capacitor package 126 is removable from the cavity 130 without tools. Those skilled in the art will appreciate that a variety of methods are available for designing removable capacitor packages that are suitable for use in connection with the present invention. A removable capacitor package permits modification of the electrical characteristics of the test socket 106, which makes the test socket 106 useful for testing packaged electronic circuits intended for use with different production sockets. The capacitors 128 are not limited to being exclusively packaged in the capacitor package 126 or being exclusively embedded in the body 112. In another embodiment, one of the capacitors 128 is embedded in the body 112 (as shown in FIG. 1B) and one of the capacitors 128 is embedded in the capacitor package 126 which is embedded in the body 112 (as shown in FIG. 1C).

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A test socket comprising:
   a body having a surface;
   a plurality of electrical connectors disposed on the surface, the plurality of electrical connectors including one or more designated pairs of electrical connectors in which each of the one or more designated pairs comprises a first electrical connector and a second electrical connector; and
   one or more capacitors wherein one of the one or more capacitors connects the first electrical connector to the second electrical connector in each of the one or more designated pairs and wherein the one of the one or more capacitors is formed in a package that can be removed from the body.

2. The test socket of claim 1, wherein at least one of the plurality of electrical connectors comprises a pogo pin connector.

3. The test socket of claim 2, wherein each of the one or more designated pairs of electrical connectors comprise power connectors.

4. The test socket of claim 3, wherein each of the one or more capacitors comprises a high frequency capacitor.

5. The test socket of claim 4, wherein the high frequency capacitor comprises a ceramic capacitor.

6. The test socket of claim 1, wherein the one or more capacitors are embedded in the body.

7. The test socket of claim 1, wherein the one or more capacitors are embedded in a package and the package is embedded in the body.

8. A tester for a packaged electronic circuit comprising:
   a test socket for the packaged electronic circuit comprising:
   a body having a surface;
   a plurality of electrical connectors disposed on the surface, the plurality of electrical connectors including one or more designated pairs of electrical connectors in which each of the one or more designated pairs comprises a first electrical connector and a second electrical connector;
   one or more capacitors wherein one of the one or more capacitors connects the first electrical connector to the second electrical connector in each of the one or more designated pairs;
   a substrate on which the test socket is mounted; and
   a control unit coupled to the substrate.

9. The tester for a packaged electronic circuit of claim 8, wherein at least one of the one or more capacitors is embedded in the body and at least one of the one or more capacitors is embedded in a package embedded in the body.

10. The tester for a packaged electronic circuit of claim 9, wherein the package is a removable package.

11. The tester for a packaged electronic circuit of claim 10, wherein each of the one or more capacitors has a capacitance value that lowers the inductance of one of the one or more designated pairs of electronic connectors.

12. The tester for a packaged electronic circuit of claim 11, wherein a production socket for the packaged electronic circuit has one or more production socket electrical characteristics and the test socket for the packaged electronic circuit has one or more test socket electrical characteristics and each of the one or more capacitors has a capacitance value such that the one or more test socket electrical characteristics are substantially identical to the one or more production socket electrical characteristics.

13. The tester for a packaged electronic circuit of claim 12, wherein the first electrical connector has a first inductance and the second electrical connector has a second inductance and the one of the one or more capacitors connecting the first electrical connector to the second electrical connector in each of the one or more designated pairs has a capacitance value that reduces the first inductance and the second inductance in each of the designated pairs of electrical connectors.

14. The tester for a packaged electronic circuit of claim 13, wherein each of the plurality of electrical connectors is capable of operating after 10,000 insertions.

* * * * *